US008683164B2

(12) United States Patent
Jeddeloh (10) Patent No.: US 8,683,164 B2
(45) Date of Patent: Mar. 25, 2014

(54) STACKED-DIE MEMORY SYSTEMS AND METHODS FOR TRAINING STACKED-DIE MEMORY SYSTEMS

(75) Inventor: Joe M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 943 days.

(21) Appl. No.: 12/365,712

(22) Filed: Feb. 4, 2009

(65) Prior Publication Data

US 2010/0195421 A1    Aug. 5, 2010

(51) Int. Cl.
*G06F 13/10* (2006.01)

(52) U.S. Cl.
USPC .......................................... 711/167

(58) Field of Classification Search
USPC .......................................... 711/167
See application file for complete search history.

(56) References Cited

U.S. PATENT DOCUMENTS

| 7,009,872 B2 * | 3/2006 | Alva ............................ 365/158 |
| 2007/0028031 A1 * | 2/2007 | Peterson et al. ............... 711/103 |
| 2007/0067826 A1 * | 3/2007 | Conti ................................. 726/2 |
| 2007/0153588 A1 | 7/2007 | Janzen |
| 2008/0084725 A1 | 4/2008 | Lahtinen et al. |
| 2009/0119533 A1 * | 5/2009 | Kim et al. ...................... 713/401 |
| 2010/0005281 A1 * | 1/2010 | Buchmann et al. ............... 713/2 |
| 2010/0121994 A1 * | 5/2010 | Kim et al. ........................ 710/51 |

FOREIGN PATENT DOCUMENTS

| JP | 2008166831 A | 7/2008 |
| WO | WO-2010091094 A2 | 8/2010 |
| WO | WO-2010091094 A3 | 10/2010 |

OTHER PUBLICATIONS

"International Application Serial No. PCT/US2010/023067, Search Report mailed Sep. 2, 2010", 6 pgs.
"International Application Serial No. PCT/US2010/023067, Written Opinion mailed Sep. 2, 2010", 4 pgs.

* cited by examiner

*Primary Examiner* — Kenneth Lo
(74) *Attorney, Agent, or Firm* — Schwegman, Lundberg & Woessner, P.A.

(57) ABSTRACT

Systems and methods are disclosed herein, such as those that operate to control a set of delays associated with one or more data clocks to clock a set of data bits into one or more transmit registers, one or more data strobes to transfer the set of data bits to at least one receive register, and/or a set of memory array timing signals to access a memory array on a die associated with a stacked-die memory vault. Systems and methods herein also include those that perform data eye training operations and/or memory array timing training operations associated with the stacked-die memory vault.

19 Claims, 11 Drawing Sheets

STACKED-DIE MEMORY SYSTEMS AND METHODS FOR TRAINING STACKED-DIE MEMORY SYSTEMS

TECHNICAL FIELD

Various embodiments described herein relate to apparatus, systems, and methods associated with semiconductor memories, including stacked-die memory systems and methods for training the same.

BACKGROUND INFORMATION

Microprocessor technology has evolved at a faster rate than that of semiconductor memory technology. As a result, a mis-match in performance often exists between the modern host processor and the semiconductor memory subsystem to which the processor is mated to receive instructions and data. For example, it is estimated that some high-end servers idle three out of four clocks waiting for responses to memory requests.

In addition, the evolution of software application and operating system technology has increased demand for higher-density memory systems as the number of processor cores and threads continues to increase. However, current-technology memory systems often represent a compromise between performance and density. Higher bandwidths may limit the number of memory cards or modules that may be connected in a system without exceeding JEDEC electrical specifications.

Extensions to the JEDEC interface have been proposed but may be generally found lacking as to future anticipated memory bandwidths and densities. Weaknesses include lack of memory power optimization and the uniqueness of the interface between the host processor and the memory subsystem. The latter weakness may result in a need to redesign the interface as processor and/or memory technologies change.

DETAILED DESCRIPTION

Figure 1:
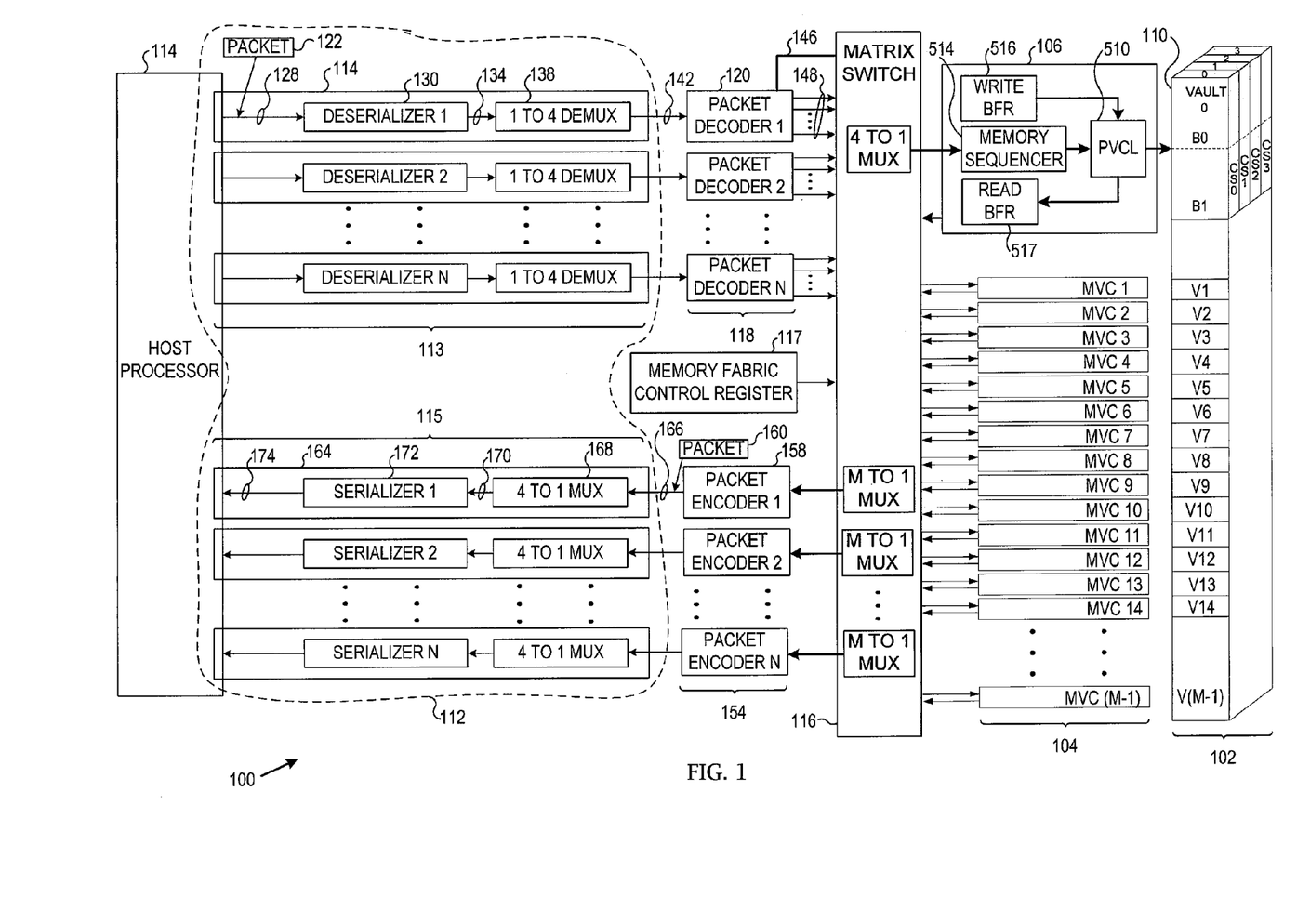
FIG. 1 is a block diagram of a memory system according to various example embodiments of the current invention.

FIG. 1 is a block diagram of a memory system 100 according to various example embodiments of the current invention. One or more embodiments operate to substantially concurrently transfer a plurality of outbound streams of commands, addresses, and/or data between one or more originating devices (e.g., one or more host processors) and a set of stacked-array memory "vaults." Increased memory system density, bandwidth, parallelism, and scalability may result.

Multi-die memory array embodiments herein aggregate control logic that is normally located on each individual memory array die in previous designs. Subsections of a stacked group of dies, referred to herein as a "memory vault," share common control logic. The memory vault architecture strategically partitions memory control logic to increase energy efficiency while providing a finer granularity of powered-on memory banks. Embodiments herein also enable a standardized host processor to memory system interface. The standardized interface may reduce re-design cycle times as memory technology evolves.

Figure 2:
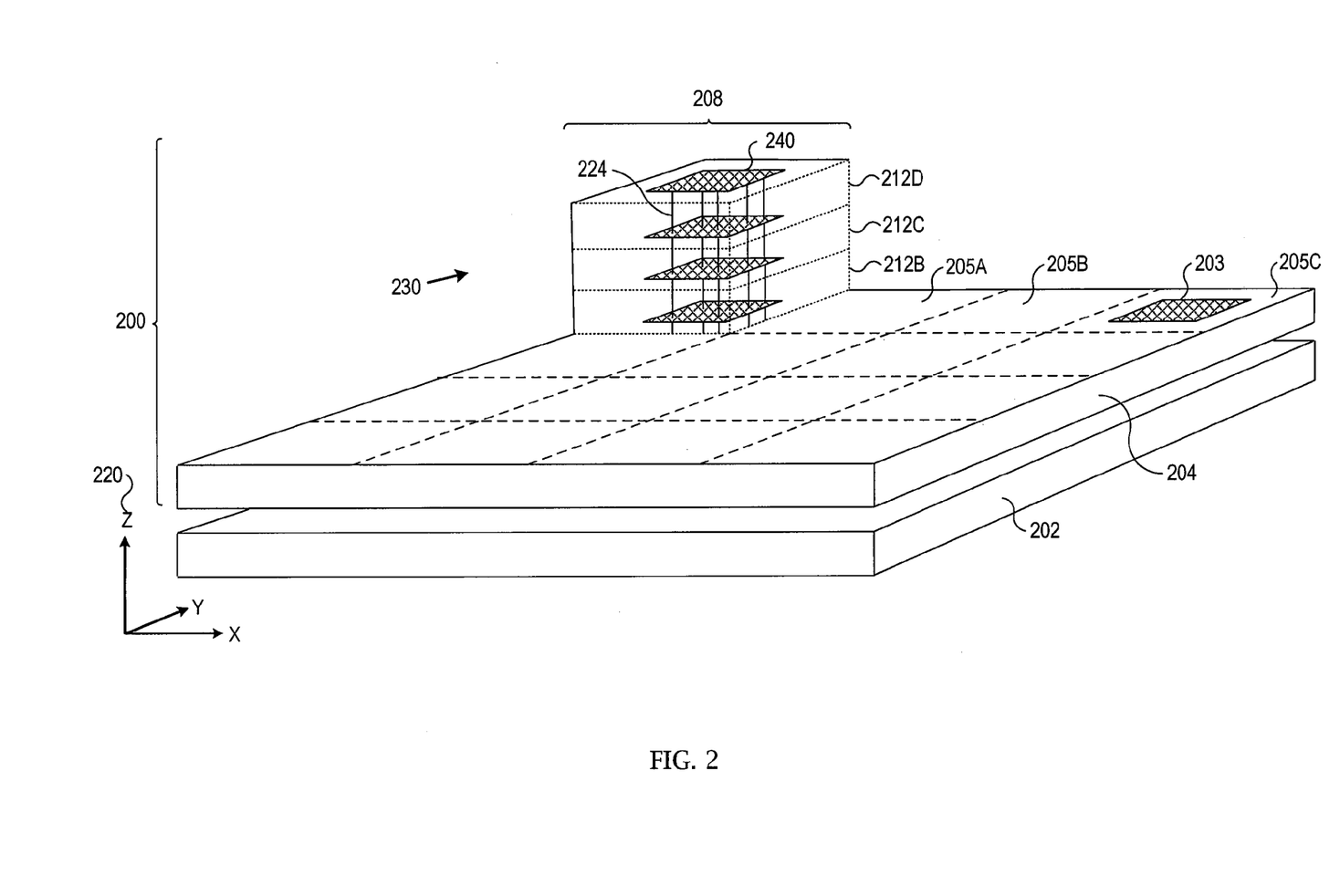
FIG. 2 is a cut-away conceptual view of a stacked-die 3D memory array stacked with a logic die according to various example embodiments.

FIG. 2 is a cut-away conceptual view of a stacked-die 3D memory array 200 stacked with a logic die 202 according to various example embodiments. The memory system 100 incorporates one or more stacks of tiled memory arrays such as the stacked-die 3D memory array 200. Multiple memory arrays (e.g., the memory array 203) are fabricated onto each of a plurality of stacked dies (e.g., the stacked die 204, used hereinafter as an example).

Each of the stacked dies is logically divided into multiple "tiles" (e.g., the tiles 205A, 205B, and 205C associated with the stacked die 204). Each tile (e.g., the tile 205C) may include one or more memory arrays 203. In some embodiments, each memory array 203 may be configured as one or more independent memory banks in the memory system 100. The memory arrays 203 are not limited to any particular memory technology and may include dynamic random-access memory (DRAM), static random access memory (SRAM), flash memory, etc.

A stacked set of memory array tiles 208 may include a single tile from each of the stacked dies (e.g., the tiles 212B, 212C and 212D, with the base tile hidden from view in FIG. 1). Power, address, and/or data and similar common signals may traverse the stacked set of tiles 208 in the "Z" dimension 220 on conductive paths (e.g., the conductive path 224) such as "through-wafer interconnects" (TWIs). The stacked-die 3D memory array 200 is thus partitioned into a set of memory "vaults" (e.g., the memory vault 230). Each memory vault includes a stacked set of tiles, one tile from each of a plurality of stacked dies. Each tile of the vault includes one or more memory arrays (e.g., the memory array 240).

The resulting set of memory vaults 102 is shown in FIG. 1. Control, switching, and communication logic described here below is fabricated onto the logic die 202. The memory system 100 includes a plurality of memory vault controllers (MVCs) 104 (e.g., the MVC 106, used hereinafter as an example MVC). Each MVC is communicatively coupled to a corresponding memory vault (e.g., the memory vault 110) in a one-to-one relationship. Each MVC is thus capable of communicating with a corresponding memory vault independently from communications between other MVCs and their respective memory vaults.

The memory system 100 also includes a plurality of configurable serialized communication link interfaces (SCLIs) 112. The SCLIs 112 are divided into an outbound group of SCLIs 113 (e.g., the outbound SCLI 114) and an inbound group of SCLIs 115. Each of the plurality of SCLIs 112 is capable of concurrent operation with the other SCLIs 112. Together the SCLIs 112 communicatively couple the plurality of MVCs 104 to one or more host processor(s) 114. The memory system 100 presents a highly abstracted, multi-link, high-throughput interface to the host processor(s) 114.

The memory system 100 may also include a matrix switch 116. The matrix switch 116 is communicatively coupled to the plurality of SCLIs 112 and to the plurality of MVCs 104.

The matrix switch 116 is capable of cross-connecting each SCLI to a selected MVC. The host processor(s) 114 may thus access the plurality of memory vaults 102 across the plurality of SCLIs 112 in a substantially simultaneous fashion. This architecture can provide the host processor-to-memory bandwidth needed by modern processor technologies, including multi-core technologies.

The memory system 100 may also include a memory fabric control register 117 communicatively coupled to the matrix switch 116. The memory fabric control register 117 accepts memory fabric configuration parameters from a configuration source and configures one or more components of the memory system 100 to operate according to a selectable mode. For example, the matrix switch 116 and each of the plurality of memory vaults 102 and the plurality of MVCs 104 may normally be configured to operate independently of each other in response to separate memory requests. Such a configuration may enhance memory system bandwidth as a result of the parallelism between the SCLIs 112 and the memory vaults 102.

Alternatively, the memory system 100 may be reconfigured via the memory fabric control register 117 to cause a subset of two or more of the plurality of memory vaults 102 and a corresponding subset of MVCs to operate synchronously in response to a single request. The latter configuration may be used to access a wider-than-normal data word to decrease latency, as further described below. Other configurations may be enabled by loading a selected bit pattern into the memory fabric control register 117.

Figure 3:
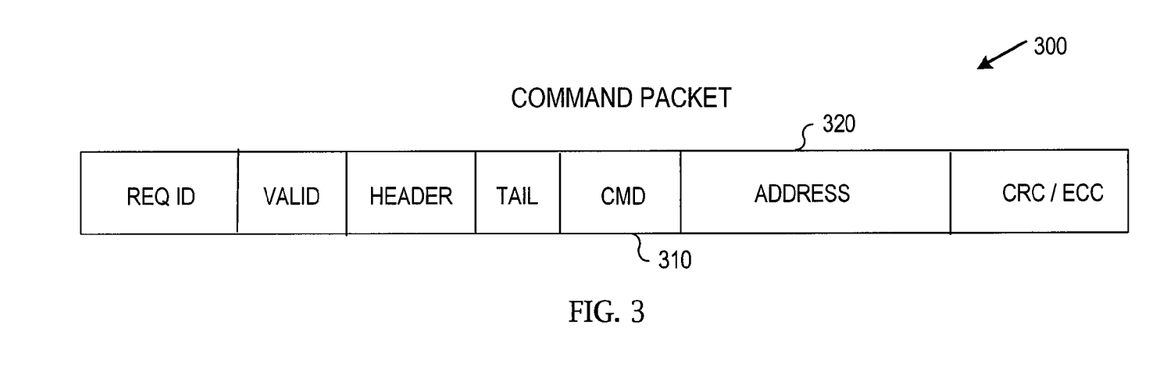
FIGS. 3 and 4 are packet diagrams showing fields associated with example packets according to various example embodiments.
Figure 4:
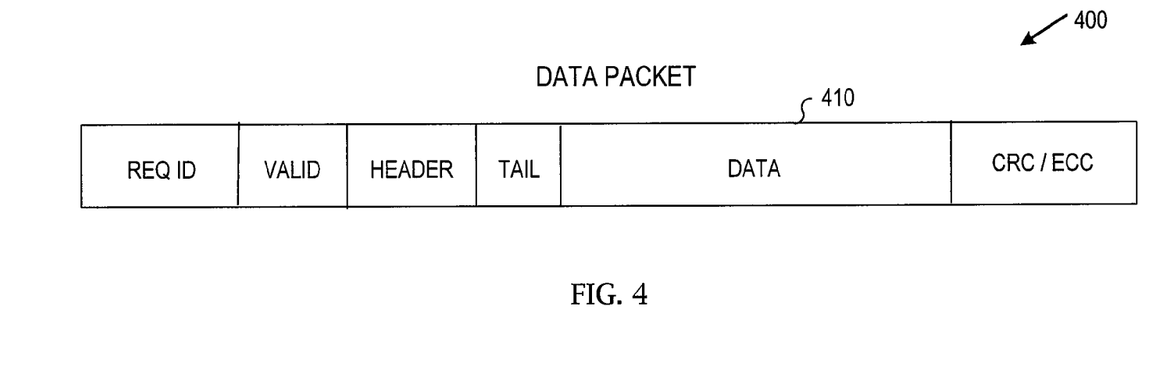

FIGS. 3 and 4 are packet diagrams showing fields associated with example packets 300 and 400, respectively, according to various example embodiments. Turning to FIG. 1 in light of FIGS. 3 and 4, the memory system 100 may also include a plurality of packet decoders 118 (e.g., the packet decoder 120) communicatively coupled to the matrix switch 116. The host processor(s) 114 assemble an outbound packet 122 that in some embodiments may be similar in structure to the example packet 300 or 400. That is, the outbound packet 122 may contain a command field 310, an address field 320, and/or a data field 410. The host processor 114 then sends the outbound packet 122 across an outbound SCLI (e.g., the outbound SCLI 114) to the packet decoder 120 in a manner further explained below.

The outbound SCLI 114 may include a plurality of outbound differential pair serial paths (DPSPs) 128. The DPSPs 128 are communicatively coupled to the host processor(s) 114 and may collectively transport the outbound packet 122. That is, each DPSP of the plurality of outbound DPSPs 128 may transport a first data rate outbound sub-packet portion of the outbound packet 122 at a first data rate.

The outbound SCLI 114 may also include a deserializer 130 communicatively coupled to the plurality of outbound DPSPs 128. The deserializer 130 converts each first data rate outbound sub-packet portion of the outbound packet 122 to a plurality of second data rate outbound sub-packets. The plurality of second data rate outbound sub-packets is sent across a first plurality of outbound single-ended data paths (SEDPs) 134 at a second data rate. The second data rate is slower than the first data rate.

The outbound SCLI 114 may also include a demultiplexer 138 communicatively coupled to the deserializer 130. The demultiplexer 138 converts each of the plurality of second data rate outbound sub-packets to a plurality of third data rate outbound sub-packets. The plurality of third data rate outbound sub-packets is sent across a second plurality of outbound SEDPs 142 to the packet decoder 120 at a third data rate. The third data rate is slower than the second data rate.

The packet decoder 120 receives the outbound packet 122 and extracts the command field 310 (e.g., of the example packet 300), the address field 320 (e.g., of the example packet 300), and/or the data field (e.g., of the example packet 400). In some embodiments, the packet decoder 120 decodes the address field 320 to determine a corresponding set of memory vault select signals. The packet decoder 120 presents the set of memory vault select signals to the matrix switch 116 on an interface 146. The vault select signals cause the input data paths 148 to be switched to the MVC 106 corresponding to the outbound packet 122.

Turning now to a discussion of the inbound data paths, the memory system 100 may include a plurality of packet encoders 154 (e.g., the packet encoder 158) communicatively coupled to the matrix switch 116. The packet encoder 158 may receive an inbound memory command, an inbound memory address, and/or inbound memory data from one of the plurality of MVCs 104 via the matrix switch 116. The packet encoder 158 encodes the inbound memory command, address, and/or data into an inbound packet 160 for transmission across an inbound SCLI 164 to the host processor(s) 114.

In some embodiments, the packet encoder 158 may segment the inbound packet 160 into a plurality of third data rate inbound sub-packets. The packet encoder 158 may send the plurality of third data rate inbound sub-packets across a first plurality of inbound single-ended data paths (SEDPs) 166 at a third data rate. The memory system 100 may also include a multiplexer 168 communicatively coupled to the packet encoder 158. The multiplexer 168 may multiplex each of a plurality of subsets of the third data rate inbound sub-packets into a second data rate inbound sub-packet. The multiplexer 168 sends the second data rate inbound sub-packets across a second plurality of inbound SEDPs 170 at a second data rate that is faster than the third data rate.

The memory system 100 may further include a serializer 172 communicatively coupled to the multiplexer 168. The serializer 172 aggregates each of a plurality of subsets of the second data rate inbound sub-packets into a first data rate inbound sub-packet. The first data rate inbound sub-packets are sent to the host processor(s) 114 across a plurality of inbound differential pair serial paths (DPSPs) 174 at a first data rate that is faster than the second data rate. Command, address, and data information is thus transferred back and forth between the host processor(s) 114 and the MVCs 104 across the SCLIs 112 via the matrix switch 116.

Figure 5A:
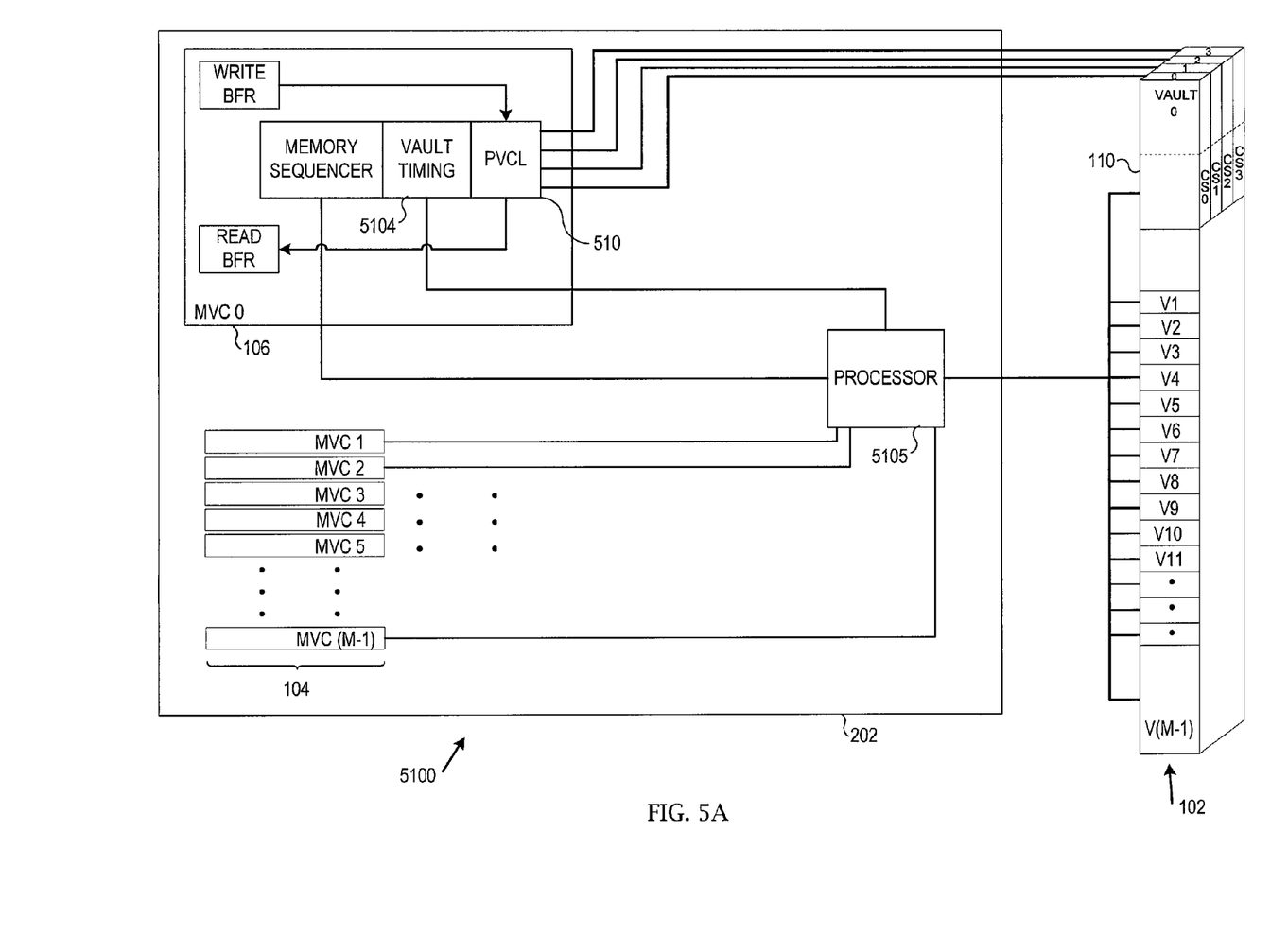
FIGS. 5A and 5B are block diagrams of a memory system according to various example embodiments.

Turning to FIG. 5A, the memory system 5100 includes one or more stacked-die memory vaults 102 (e.g., the memory vault 110) organized as previously described. The memory system 5100 also includes one or more MVCs 104 (e.g., the MVC 106) communicatively coupled to the memory vaults 102 in a one-to-one correspondence to provide memory sequencing operations. Each of the MVCs 104 also includes a vault timing module 5104. A processor 5105 on the logic die 202 is communicatively coupled to the vault timing module 5104. The processor 5105 and the vault timing module 5104 operate cooperatively to perform one or more of a sequence of write data interface training operations, a sequence of memory array access signal training operations, and/or a sequence of read interface training operations.

Figure 5B:
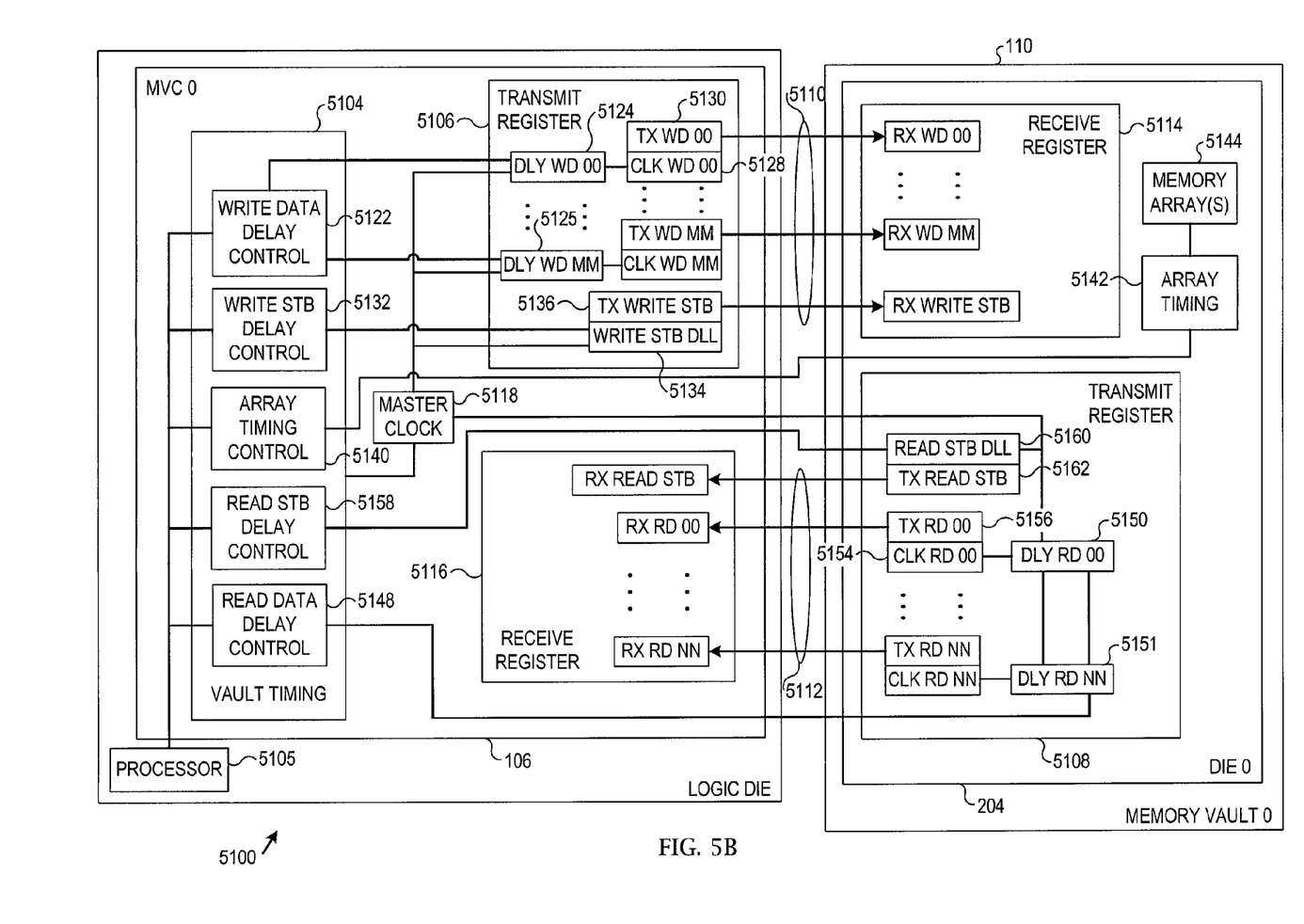

Turning to FIG. 5B, the vault timing module 5104 provides centralized control of one or more (e.g., a plurality of, such as a set of) delays associated with one or more data clocks to clock one or more data digits (e.g., bits) into one or more transmit registers (e.g., the transmit registers 5106 and 5108). The transmit registers 5106 and 5108 are associated with a write data interface 5110 and a read data interface 5112, respectively, between the MVC 106 and the memory vault 110.

The vault timing module 5104 may also control a set of delays associated with a set of data strobes used to transfer the set of data bits to one or more receive registers (e.g., the receive registers 5114 and 5116 associated with the write data interface 5110 and the read data interface 5112, respectively).

In some embodiments, the vault timing module 5104 also controls a set of memory array timing parameters associated with memory array access. The memory array timing parameters may include a row cycle time (tRC) and/or a row address to column address delay (tRCD) period, among others.

A master clock module 5118 may be communicatively coupled to the vault timing module 5104 to provide a master clock from which to derive the set of data clocks and/or the set of data strobes.

The memory system 5100 may include a write data delay control module 5122 as a component of the vault timing module 5104. A plurality of write clock delay elements (e.g., the delay elements 5124 and 5125) are communicatively coupled to the write data delay control module 5122. A write clock delay element (e.g., the delay element 5124) may receive a delay control command from the write data delay control module 5122. The delay element 5124 may also receive a master clock signal from the master clock 5118. The delay element 5124 delays the master clock signal according to the delay command (e.g., by an amount indicated by the delay command). The delay element presents the resulting delayed clock signal to a write clock input (e.g., the write clock input 5128) of the transmit register 5106. The delayed clock signal clocks one or more write data bits into one or more storage cells (e.g., the storage cell 5130) of the transmit register 5106.

The memory system 5100 may also include a write strobe delay control module 5132 as a component of the vault timing module 5104. A write strobe delay element 5134 (e.g., a delay-lock loop (DLL) or a phase-lock loop (PLL)) is communicatively coupled to the write strobe delay control module 5132. The write strobe delay element 5134 may receive a delay control command from the write strobe delay control module 5132 and a master clock signal from the master clock 5118. The write strobe delay element 5134 delays the master clock signal by an amount indicated by the delay control command. The write strobe delay element 5134 presents the resulting delayed write strobe to a write strobe driver 5136. The delayed write strobe strobes a set of write data bits into the receive register 5114 associated with the memory vault and/or a subsection of the memory vault (e.g., the example stacked memory die 204 associated with the memory vault 110).

The memory system 5100 may further include an array timing control module 5140 as a component of the vault timing module 5104. An array timing module 5142 may be included as a component of the stacked memory die 204 and may be communicatively coupled to the array timing control module 5140. The array timing module 5142 receives an array timing control command from the array timing control module 5140 and adjusts one or more of the memory array timing parameters according to the array timing control command. One or more memory arrays (e.g., the memory array 5144) are communicatively coupled to the array timing module 5142 and operate using memory array timing according to the memory array timing parameter.

The memory system 5100 may also include a read data delay control module 5148 as a component of the vault timing module 5104. A plurality of read clock delay elements (e.g., the delay elements 5150 and 5151) are communicatively coupled to the read data delay control module 5148. A read clock delay element (e.g., the delay element 5150) may receive a delay control command from the read data delay control module 5148. The delay element 5150 may also receive a master clock signal from the master clock 5118. The delay element 5150 delays the master clock signal by an amount indicated by the delay command. The delay element 5150 presents the resulting delayed clock signal to a read clock input (e.g., the read clock input 5154) of the transmit register 5108. The delayed clock signal clocks one or more read data bits into storage cells (e.g., the storage cell 5156) of the transmit register 5108.

The memory system 5100 may also include a read strobe delay control module 5158 as a component of the vault timing module 5104. A read strobe delay element 5160 (e.g., a DLL or a PLL) is communicatively coupled to the read strobe delay control module 5158. The read strobe delay element 5160 may receive a delay control command from the read strobe delay control module 5158 and a master clock signal from the master clock 5118. The read strobe delay element 5160 delays the master clock signal by an amount indicated by the delay control command. The read strobe delay element 5160 presents the resulting delayed read strobe to a read strobe driver 5162. The delayed read strobe strobes a set of read data bits into the receive register 5116 associated with the MVC.

Any of the components previously described may be implemented in a number of ways, including embodiments in hardware, software, firmware, or combinations thereof. It is noted that "software" in this context refers to statutory software structures stored on a computer-readable medium to be executed by a computer, and not to mere software listings.

Thus, the memory systems 100, 5100; the memory arrays 200, 203, 240, 527, 5144; the die 202, 204; the tiles 205A, 205B, 205C, 208, 212B, 212C, 212D; the "Z" dimension 220; the paths 224, 148, 542; the memory vaults 230, 102, 110; the MVCs 104, 106; the SCLIs 112, 113, 114, 115, 164; the processors 114, 5004; the matrix switch 116; the register 117; the packets 300, 400, 122, 160; the packet decoders 118, 120; the fields 310, 320, 410; the DPSPs 128, 174; the deserializer 130; the SEDPs 134, 142, 166, 170; the demultiplexer 138; the interface 146; the packet encoders 154, 158; the multiplexer 168; the serializer 172; the vault timing module 5104; the processor 5105; the registers 5106, 5108, 5114, 5116; the interfaces 5110, 5112; the clock module 5118; the control modules 5122, 5132, 5140, 5148, 5158; the delay elements 5124, 5125, 5134, 5150, 5151, 5160; the clock inputs 5128, 5154; the storage cells 5130, 5156; the drivers 5136, 5162; and the timing module 5142 may all be characterized as "modules" herein.

The modules may include hardware circuitry, optical components, single or multi-processor circuits, memory circuits, software program modules and objects stored on a computer-readable medium, firmware, and combinations thereof, as desired by the architect of the memory system 100 and as appropriate for particular implementations of various embodiments.

The apparatus and systems of various embodiments may be useful in applications other than high-density, multi-link, high-throughput semiconductor memory systems such as the system 100 and the system 5100. Thus, various embodiments of the invention are not to be so limited. The example memory systems 100 and 5100 are intended to provide a general understanding of the structure of various embodiments. They are not intended to serve as a complete description of all the elements and features of apparatus and systems that might make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 6A:
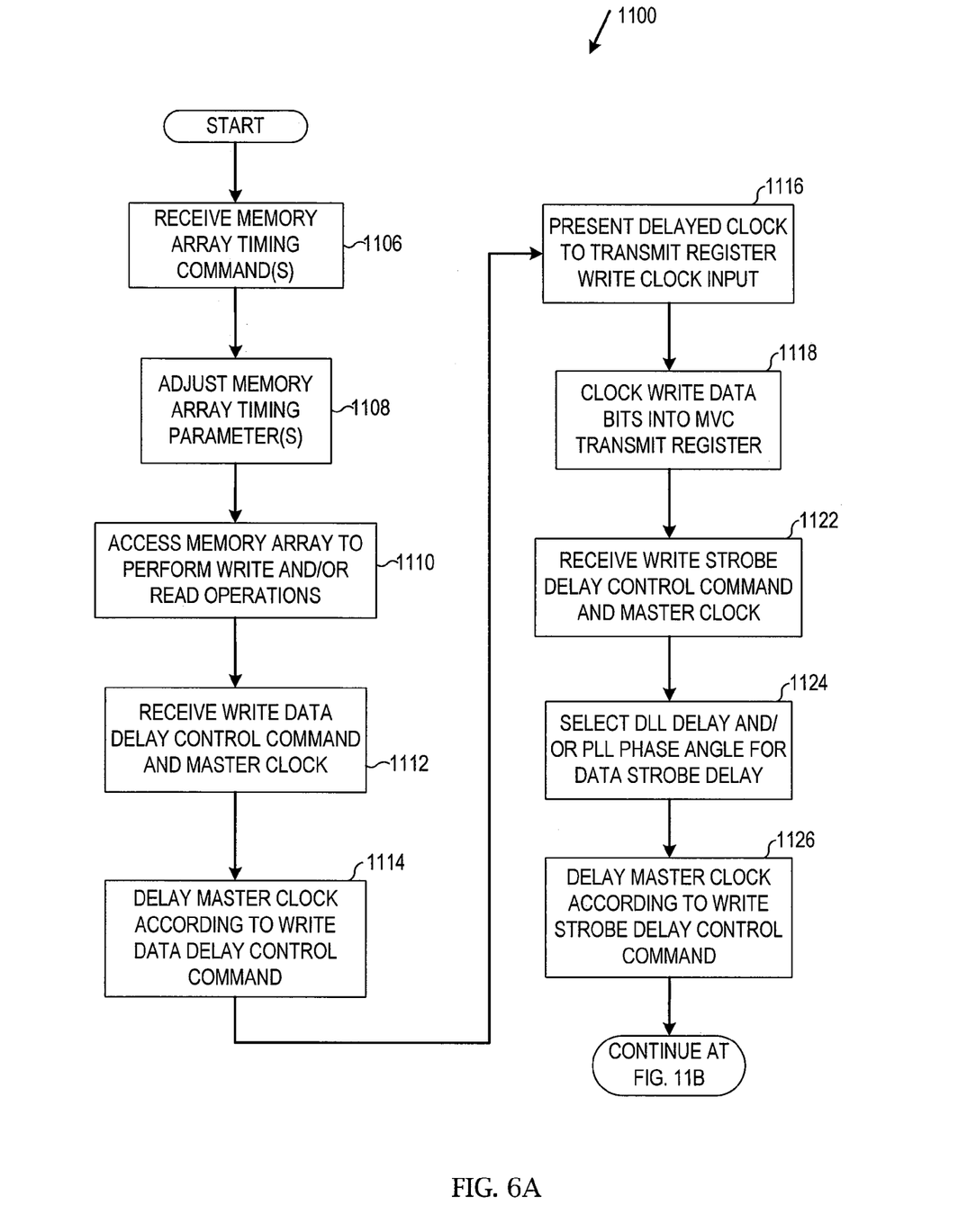
FIGS. 6A and 6B are flow diagrams illustrating a method according to various example embodiments.
Figure 6B:
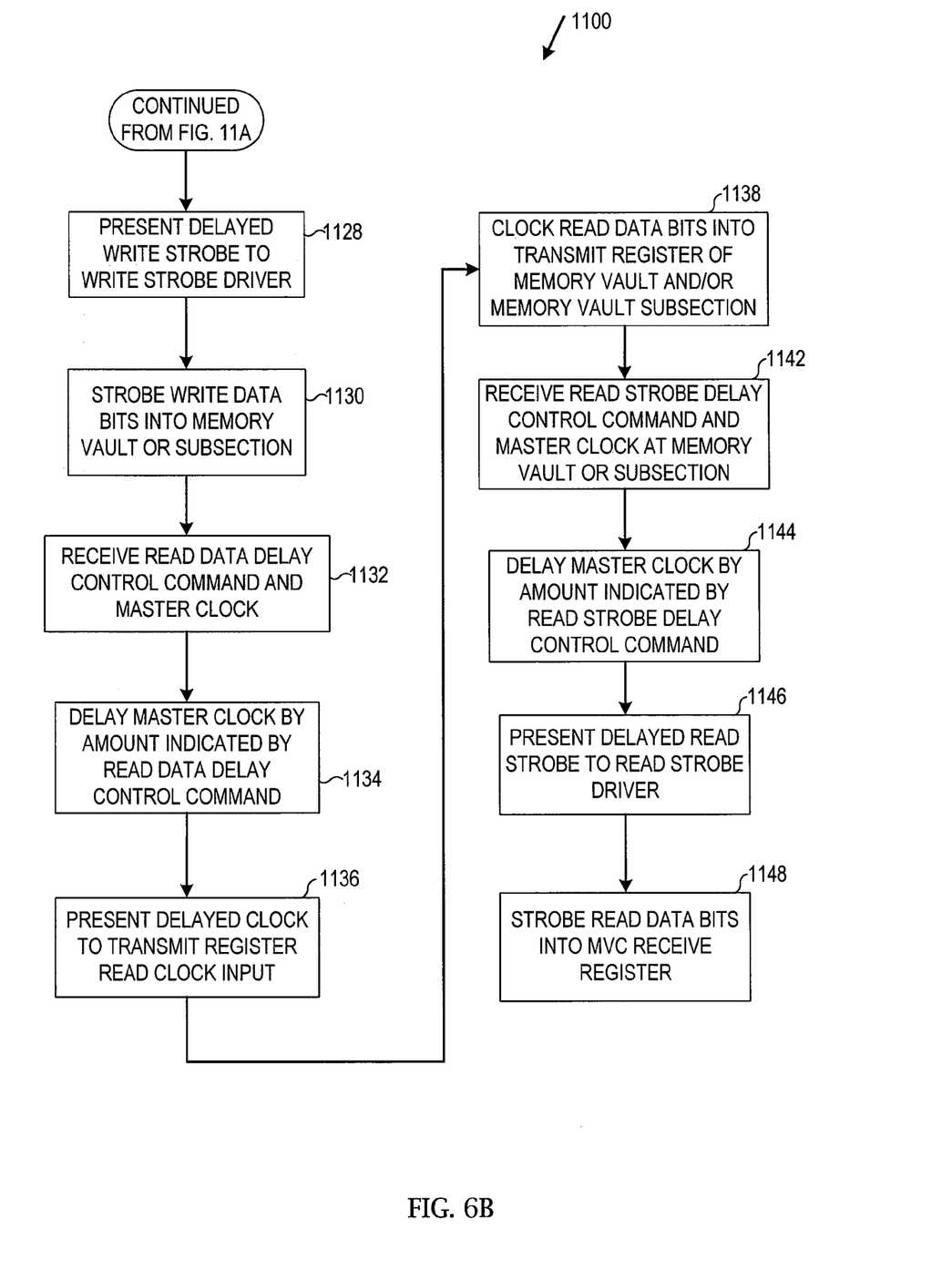

FIGS. 6A and 6B are flow diagrams illustrating a method 1100 according to various example embodiments. The method 1100 may include programmatically controlling a set of delays associated with one or more data clocks. The data clocks are used to clock a set of data digits (e.g., bits) into one or more transmit registers (e.g., the transmit registers 5106, 5108 of FIG. 5B) associated with an interface (e.g., the interfaces 5110, 5112 of FIG. 5B) used to transfer data between an MVC and a memory vault corresponding to the MVC. The transmit registers may be located on the MVC to present write data to the interface or may be located on a memory array die in the memory vault to present read data to the interface.

The method 1100 may also include programmatically controlling a set of delays associated with one or more data strobes used to transfer the set of data bits to one or more receive registers on the MVC and/or on the memory vault. The method 1100 may further include programmatically controlling one or more parameters associated with memory array access (e.g., memory array timing signals used to access a memory array on the memory array die).

The method 1100 may commence at block 1106 with receiving one or more memory array timing control commands from an array timing control module (e.g., the array timing control module 5140 associated with the MVC 106 of FIG. 5B). The method 1100 may continue with adjusting one or more memory array timing parameters associated with the memory array according to the array timing control command(s), at block 1108. The timing parameters may include tRC and/or tRCD, among others, as previously mentioned. The method 1100 may include accessing the memory array to perform write data and/or read data operations using memory array timing according to the adjusted memory array timing parameter(s), at block 1110.

The method 1100 may also include receiving a delay control command from a write data delay control module and a master clock signal from a master clock, at block 1112. The master clock signal may be delayed by an amount indicated by the delay control command, at block 1114. The method 1100 may further include presenting the delayed clock signal to a write clock input of a transmit register associated with the MVC, at block 1116. Consequently, one or more write data bits may be clocked into a storage cell(s) of a transmit register associated with the MVC, at block 1118.

The method 1100 may continue at block 1122 with receiving a delay control command from a write strobe delay control module and a master clock signal from a master clock. The method 1100 may include selecting a delay associated with a DLL and/or a phase angle associated with a PLL to delay one or more of the set of data strobes, at block 1124. The master clock signal may be delayed by an amount indicated by the delay control command, at block 1126. Turning to FIG. 6B, the method 1100 may include presenting the delayed write strobe to a write strobe driver, at block 1128. As a result, a set of write data bits may be strobed into a receive register associated with the memory vault and/or a subsection of the memory vault (e.g., the stacked die 204 associated with the memory vault 110 of FIG. 5B), at block 1130.

The method 1100 may continue at block 1132 with receiving a delay control command from a read data delay control module and a master clock signal from a master clock. The master clock signal may be delayed by an amount indicated by the delay control command, at block 1134. The method 1100 may include presenting the delayed clock signal to a read clock input of a transmit register associated with the memory vault and/or a subsection of the memory vault, at block 1136. Consequently, one or more read data bits may be clocked into a storage cell(s) of the transmit register associated with the memory vault and/or subsection of the memory vault, at block 1138.

The method 1100 may continue further at block 1142 with receiving a delay control command from a read strobe delay control module and a master clock signal from a master clock. The master clock signal may be delayed by an amount indicated by the delay control command, at block 1144. The method 1100 may include presenting a delayed read strobe to a read strobe driver, at block 1146. As a result, a set of read data bits may be strobed into a receive register associated with the MVC, at block 1148.

Figure 7:
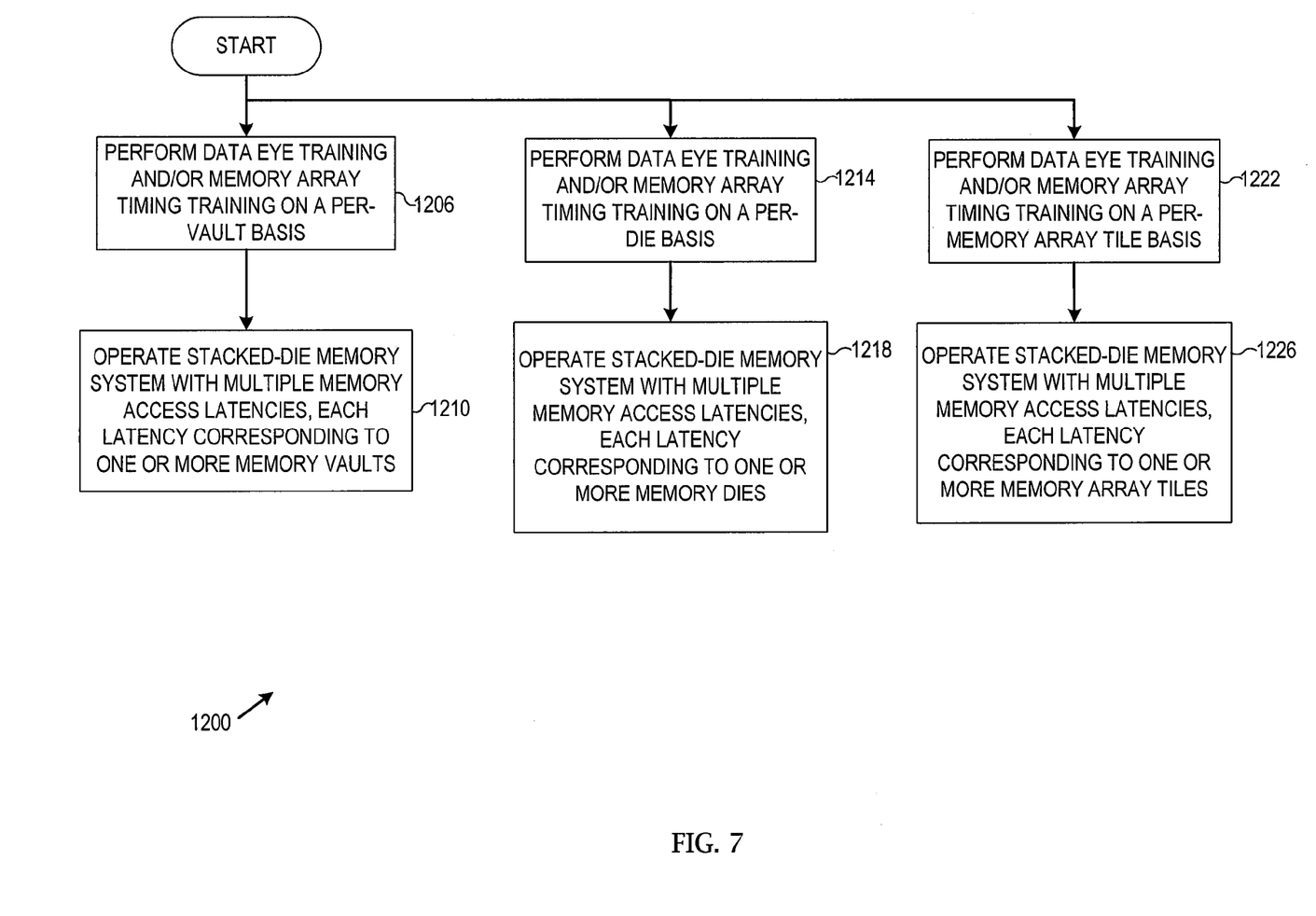
FIG. 7 is a flow diagram illustrating a method according to various example embodiments.

FIG. 7 is a flow diagram illustrating a method 1200 according to various example embodiments. The method 1200 may include training data and/or strobe timing at a memory vault, stacked die, and/or memory array level. The method 1200 may also include training memory array access timing signals such as tRC and/or tRCD. Performing timing signal training operations on a per-vault basis in a multi-vault memory system and/or on a vault subsection basis may allow the various memory vaults and/or subsections to operate with differential access latencies. Increased manufacturing yields may result.

The method 1200 may commence at block 1206 with performing one or more independent data eye training operations (e.g., data and/or strobe timing) and/or independent memory array timing training operations for each of several memory vaults in a stacked-die memory system. The method may continue with operating the stacked-die memory system with multiple memory access latencies, at block 1210. Each memory access latency corresponds to one or more of the memory vaults.

The method 1200 may also include performing one or more independent data eye training operations and/or independent memory array timing training operations for each of the set of stacked memory array dies associated with each vault in the memory system, at block 1214. The method may further include operating the stacked-die memory system with multiple memory die access latencies, at block 1218. Each memory die access latency corresponds to one or more of the memory array dies.

The method 1200 may continue at block 1222 with performing one or more independent data eye training operations and/or independent memory array timing training operations for each of set of memory array tiles associated with each memory array die. The method 1200 may also include operating the stacked-die memory system with multiple memory array tile access latencies, at block 1226. Each latency corresponds to one or more of the memory array tiles.

Figure 8A:
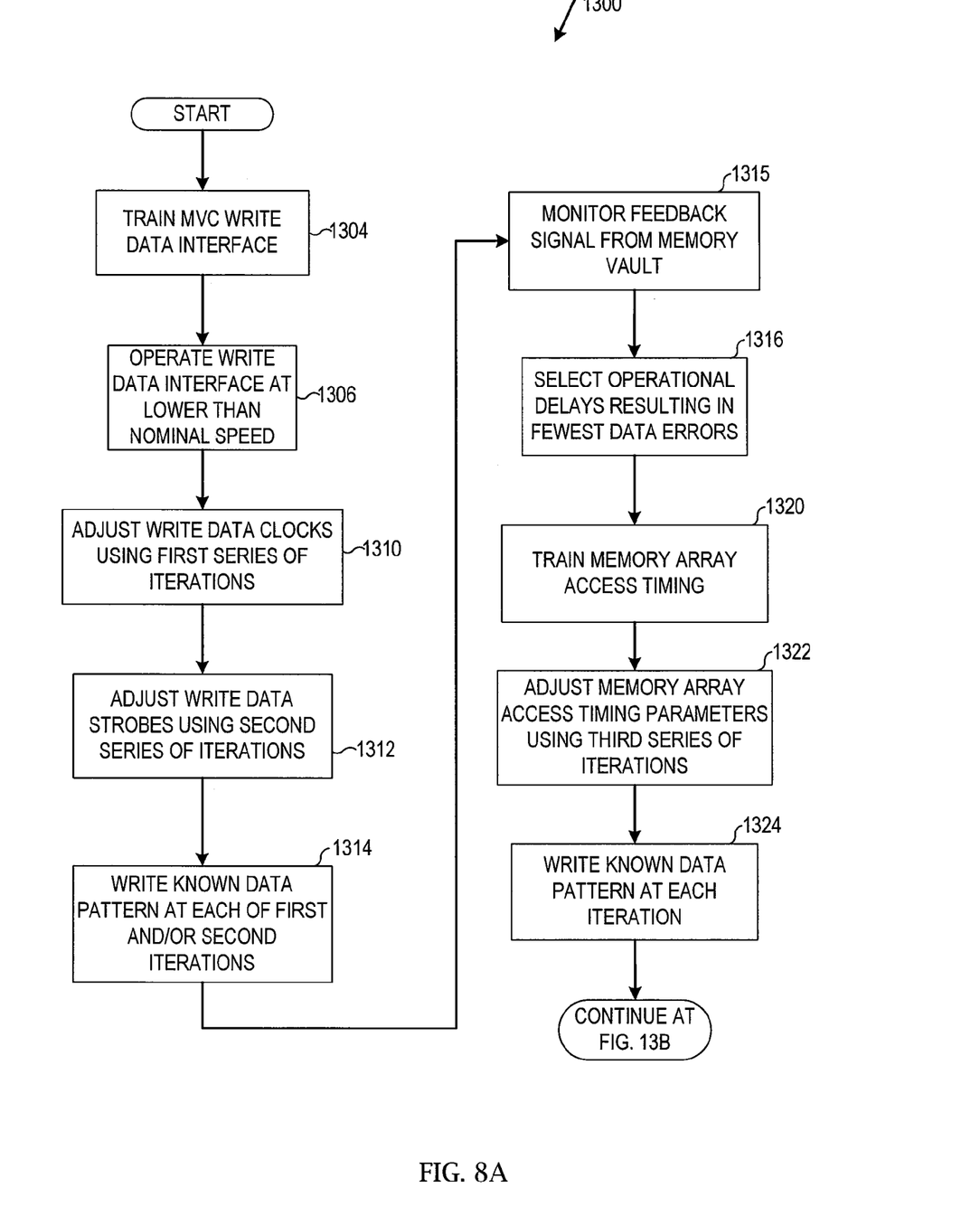
FIGS. 8A, 8B, and 8C are flow diagrams illustrating a method according to various example embodiments.
Figure 8B:
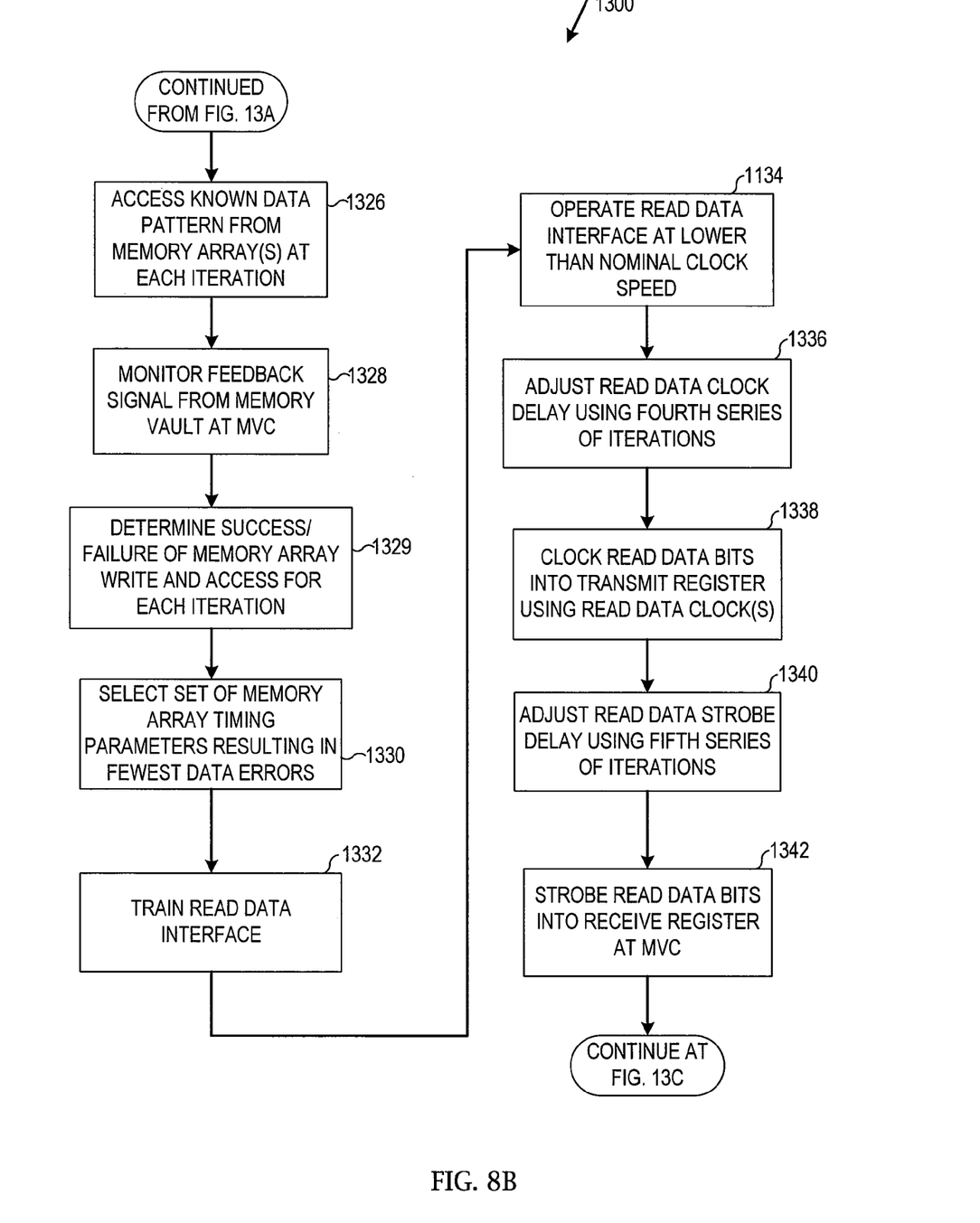
Figure 8C:
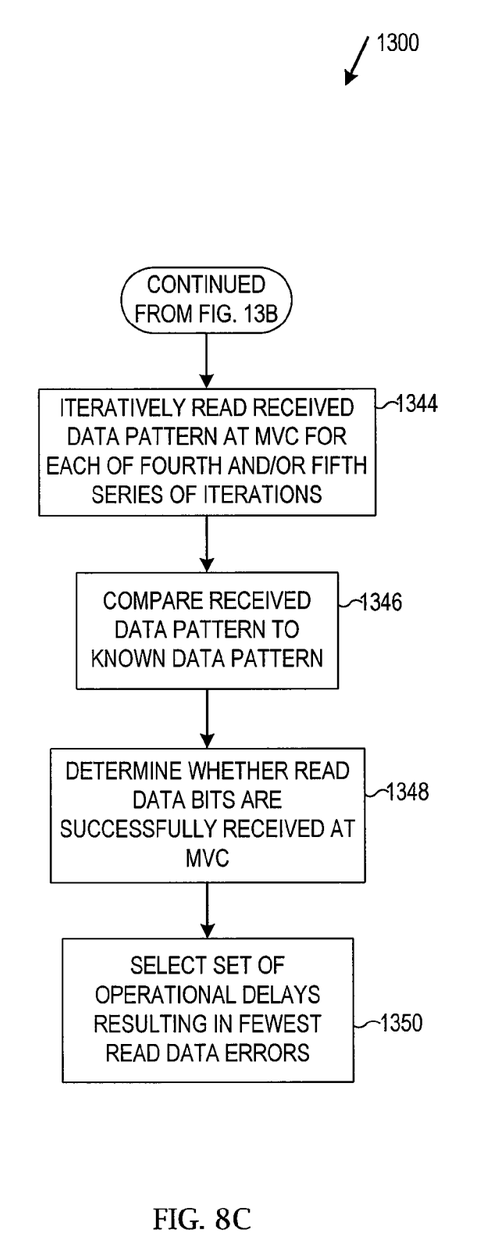

FIGS. 8A, 8B, and 8C are flow diagrams illustrating a method according to various example embodiments. The method 1300 may include performing a data eye training operation and/or a memory array timing training operation at an MVC associated with a stacked-die memory vault.

The method 1300 may commence at block 1304 with training a write data interface (e.g., the write data interface 5110 of FIG. 5B) associated with the MVC. The method 1300 may include operating the write data interface at a clock speed that is lower than a nominal clock speed, at block 1306. Doing so may facilitate the establishment of an operational write data interface prior to training.

The method 1300 may continue with incrementally adjusting a delay associated with one or more write data clocks using a first series of iterations, at block 1310. The write data clocks may be used to clock a set of write data bits into a transmit register (e.g., the transmit register 5106 of FIG. 5B). Some embodiments may also include incrementally adjusting a delay associated with a write data strobe using a second series of iterations, at block 1312. The write data strobe may be used to clock the set of write data bits into a receive register at the memory vault. The first series of iterations may be nested within the second series of iterations, or vice versa; or the delays associated with the write data clocks and the write data strobe may be iterated together.

The method 1300 may continue further at block 1314 with writing a known data pattern comprising the set of write data bits to the memory vault in accordance with the first and/or second series of iterations.

The method 1300 may also include monitoring a feedback signal from the memory vault following each adjustment of the write data clocks and/or the write data strobe to determine whether the write data bits are successfully received at the memory vault, at block 1315. The feedback signal may be configured as one or more feedback bits sent from the memory vault to the MVC to indicate a successful receipt of one or more of the write data bits at the memory vault. Alternatively, the feedback signal may be configured as one or more data words sent from the memory vault to the MVC via a reduced-speed read data interface.

The method 1300 may further include selecting a set of operational delays associated with the write data clocks and/or the write data strobe, at block 1316. A set of delays within a range of adjustment of the write data clocks and/or the write data strobe resulting in fewest data errors may be selected as the set of write data operational delays.

The method 1300 may continue at block 1320 with training memory array access timing associated with the memory vault. The method 1300 may include incrementally adjusting one or more memory array timing parameters using a third series of iterations, at block 1322. Such parameters may include memory array access timing signals such as tRC and/or tRCD. The method 1300 may also include writing a known data pattern of a set of write data bits at each iteration, at block 1324. The known data pattern may be written to one or more memory arrays on a die associated with the memory vault.

The method 1300 may continue at FIG. 8B with accessing the known data pattern from the memory array(s) at each iteration, at block 1326. A feedback signal from the memory vault may be monitored at the MVC following each adjustment of the memory array timing parameters, at block 1328. The feedback signal may be configured as one or more data words sent from the memory vault to the MVC via a reduced-speed read data interface and/or one or more feedback bits sent across some other interface, as described above.

The method 1300 may also include determining whether the write data bits have been successfully written to and read from the memory array using the feedback signal, at block 1329. The method 1300 may further include selecting a set of memory array timing parameter settings resulting in fewest data errors, at block 1330.

The method 1300 may continue at block 1332 with training the read data interface (e.g., the read data interface 5112 of FIG. 5B) associated with the memory vault or subsection thereof. Read data interface training may include operating the read data interface at a clock speed that is lower than a nominal clock speed, at block 1334. Doing so may facilitate the establishment of an operational read data interface prior to performing read interface training operations.

The method 1300 may include incrementally adjusting a delay associated with one or more read data clocks using a fourth series of iterations, at block 1336. The read data clocks may be used to clock a set of read data bits into a transmit register (e.g., the transmit register 5108 of FIG. 5B), at block 1338. The set of read data bits may comprise a known data pattern. Some embodiments may also include incrementally adjusting a delay associated with a read data strobe using a fifth series of iterations, at block 1340. The read data strobe may be used to strobe the plurality of read data bits into a receive register at the MVC, at block 1342.

Continuing at FIG. 8C, the method 1300 may thus include reading a received data pattern at the MVC for each of the fourth and/or fifth series of iterations, at block 1344, and comparing the received data pattern to the known data pattern, at block 1346. The method 1300 may further include determining whether the read data bits are successfully received at the MVC, at block 1348.

The method 1300 may further include selecting a set of operational delays associated with the read data clocks and/or the read data strobe, at block 1350. A set of delays within a range of adjustment of the read data clocks and/or the read data strobe resulting in fewest data errors may be selected as the set of read data operational delays.

It is noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using well-known mechanisms, including application program interfaces, inter-process communication techniques, and remote procedure calls, among others. The teachings of various embodiments are not limited to any particular programming language or environment.

Additionally, data clock and strobe calibration may be performed individually for each memory vault or subsection of a memory vault in a multi-vault system. For example, each die in a stack of dies corresponding to a memory vault may be separately trained. As a consequence, memory array dies with a broader range of timing capabilities may be used to manufacture a memory vault. Increased manufacturing yields and decreased costs may result.

By way of illustration and not of limitation, the accompanying figures show specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A memory system comprising:
a memory vault comprising a plurality of memory arrays, the memory arrays located on a plurality of stacked memory dies, the dies arranged in a first dimension, the memory dies including a first memory die and a second memory die, the plurality of memory arrays including a first memory array located on the first memory die and a second memory array located on the second memory die, the first memory die including a third memory array, the second memory die including a fourth memory array, the first and third memory arrays arranged in a second dimension perpendicular to the first dimension, the second and fourth memory arrays arranged in the second dimension, wherein first and second memory arrays are included in the memory vault, and wherein the third and fourth memory arrays are included in an additional memory vault; and
a memory vault controller (MVC) located on a logic die stacked with the memory dies and communicatively coupled to the memory vault to provide at least one of control, switching or communication logic associated with the memory vault, wherein the MVC is associated with a vault timing module to provide control of a delay associated with a data clock to clock a data digit into a storage cell associated with the MVC, a delay associated with a data strobe to transfer the data digit to a storage cell associated with the memory vault and/or a subsection of the memory vault, and/or a memory array timing parameter associated with memory array access, and wherein the vault timing module includes a write strobe delay control module and the MVC further includes a write strobe delay element and a write strobe driver, the write strobe delay element to receive a clock signal and a delay control command from the write strobe delay control module.

2. The memory system of claim 1, further comprising:
a processor communicatively coupled to the vault timing module to command the vault timing module to perform at least one of a sequence of write data interface training operations, a sequence of memory array access signal training operations, or a sequence of read interface training operations.

3. The memory system of claim 1, further comprising:
a master clock module communicatively coupled to the vault timing module to provide a master clock from which to derive at least one of the data clock or the data strobe.

4. The memory system of claim 1, wherein the vault timing module includes a write data delay control module and the MVC further includes a write clock delay element and a write clock input, the write clock delay element being communicatively coupled to the write data delay control module, the write clock delay element to receive a delay control command from the write data delay control module and the clock signal, and to delay the clock signal according to the delay control command from the write data delay control module, and the write clock input to clock the data digit to the storage cell associated with the MVC according to the delayed clock signal.

5. The memory system of claim 4, wherein the storage cell associated with the MVC is located on the logic die.

6. The memory system of claim 1, wherein the write clock delay element is communicatively coupled to the write strobe delay control module, and the write clock delay element to delay the clock signal according to the delay control command from the write strobe delay control module, and the write strobe driver to strobe the data digit to the storage cell associated with the memory vault and/or the subsection of the memory vault according to the delayed clock signal.

7. The memory system of claim 1, wherein the vault timing module includes an array timing control module and the memory vault includes an array timing module communicatively coupled to the array timing control module to receive an array timing control command from the array timing control module and to adjust at least one memory array timing parameter according to the array timing control command.

8. The memory system of claim 1, wherein the memory array timing parameter comprises at least one of a row cycle time (tRC) or a row address to column address delay (tRCD) period.

9. The memory system of claim 1, wherein the vault timing module includes a read data delay control module and the memory vault includes a read clock delay element and a read clock input, the read clock delay element being communicatively coupled to the read data delay control module, the read clock delay element to receive a delay control command from the read data delay control module and the clock signal, and to delay the clock signal according to the delay control command from the read data delay control module, and the read clock input to clock the data digit to a transmit register associated with the memory vault or the subsection of the memory vault according to the delayed clock signal.

10. The memory system of claim 1, wherein the vault timing module includes a read strobe delay control module and the memory vault includes a read strobe delay element and a read strobe driver, the read strobe delay element being communicatively coupled to the read strobe delay control module, the read strobe delay element to receive a delay control command from the read strobe delay control module and the clock signal, and to delay the clock signal according to the delay control command from the read strobe delay control module, and the read strobe driver to strobe the data digit to a receive register associated with the MVC according to the delayed clock.

11. The memory system of claim 10, wherein the read strobe delay element comprises at least one of a delay-lock loop or a phase-lock loop.

12. The memory system of claim 1, wherein the subsection of the memory vault is one of the memory dies.

13. A method comprising:
controlling, by a memory vault controller (MVC) located on a logic die stacked with the memory dies and communicatively coupled to the memory vault, a vault timing module to provide control of a delay associated with clocking a data digit to a storage cell associated with the MVC used to transfer data between the MVC and a memory vault corresponding to the MVC, a delay associated with a data strobe to transfer the data digit to an other storage cell associated with the interface memory vault and/or a subsection of the memory vault, or a timing parameter associated with accessing a memory array of the memory vault, the MVC including a write strobe delay element and a write strobe driver, the write strobe delay element receiving a delay control command from a clock signal and a write strobe delay control module of a vault timing module, the memory vault including a plurality of memory arrays, the plurality of memory arrays including a first memory array located on a first memory die and a second memory array located on a second memory die, the first and second memory dies arranged in a stack in a first dimension, the first memory die including a third memory array, the second memory die including a fourth memory array, the first and third memory arrays arranged in a second dimension perpendicular to the first dimension, the second and fourth memory arrays arranged in the second dimension, wherein first and second memory arrays are included in the memory vault, and wherein the third and fourth memory arrays are included in an additional memory vault.

14. The method of claim 13, wherein the storage cell associated with the interface comprises a transmit register associated with the MVC and the controlling comprises:
clocking the data digit to the transmit register associated with the MVC according to a delayed clock signal.

15. The method of claim 13, wherein the other storage cell associated with interface comprises a receive register associated with the memory array and wherein the controlling comprises:
strobing the data digit to the receive register associated with the memory array according to a delayed clock signal.

16. The method of claim 13, wherein the storage cell associated with the interface comprises a transmit register associated with the memory array and the controlling comprises:
clocking the data digit to the transmit register associated with the memory array according to a delayed clock signal.

17. The method of claim 13, wherein the other storage cell associated with the interface comprises a receive register associated with the MVC and the controlling comprises:
strobing the data digit to the receive register associated with the MVC.

18. The method of claim 13, wherein the controlling comprises:
receiving an array timing control command;
adjusting the memory array timing parameter associated with the memory array according to the timing control command; and
operating the array according to the adjusted parameter.

19. The method of claim 13, wherein the controlling comprises:
selecting at least one of a delay associated with a delay-lock loop (DLL) or a phase angle associated with a phase-lock loop (PLL) to control at least one of the delays.

* * * * *

UNITED STATES PATENT AND TRADEMARK OFFICE
CERTIFICATE OF CORRECTION

| | | |
|---|---|---|
| PATENT NO. | : 8,683,164 B2 | Page 1 of 1 |
| APPLICATION NO. | : 12/365712 | |
| DATED | : March 25, 2014 | |
| INVENTOR(S) | : Joe M. Jeddeloh | |

It is certified that error appears in the above-identified patent and that said Letters Patent is hereby corrected as shown below:

In the Claims

In column 13, line 22, in claim 13, before "memory" delete "interface".

Signed and Sealed this
Twenty-ninth Day of July, 2014

Michelle K. Lee
*Deputy Director of the United States Patent and Trademark Office*